United States Patent
Lee et al.

(10) Patent No.: US 10,381,517 B2
(45) Date of Patent: Aug. 13, 2019

(54) ALUMINUM-GALLIUM-INDIUM-PHOSPHORUS-BASED LIGHT EMITTING DIODE HAVING GALLIUM NITRIDE LAYER OF UNEVEN TYPE AND METHOD FOR MANUFACTURING SAME

(71) Applicant: AUK CORP, Iksan-si, Jeollabuk-do (KR)

(72) Inventors: Hyung Joo Lee, Iksan-si (KR); Young Jin Kim, Gimje-si (KR); In Kyu Jang, Iksan-si (KR)

(73) Assignee: AUK CORP. (KR)

(*) Notice: Subject to any disclaimer, the term of this patent is extended or adjusted under 35 U.S.C. 154(b) by 0 days.

(21) Appl. No.: 15/114,066

(22) PCT Filed: Jan. 29, 2014

(86) PCT No.: PCT/KR2014/000848
§ 371 (c)(1),
(2) Date: Jul. 25, 2016

(87) PCT Pub. No.: WO2015/115685
PCT Pub. Date: Aug. 6, 2015

(65) Prior Publication Data
US 2016/0372633 A1    Dec. 22, 2016

(51) Int. Cl.
*H01L 33/32*    (2010.01)
*H01L 33/22*    (2010.01)
(Continued)

(52) U.S. Cl.
CPC .......... *H01L 33/32* (2013.01); *H01L 33/0075* (2013.01); *H01L 33/22* (2013.01);
(Continued)

(58) Field of Classification Search
CPC ... H01L 33/32; H01L 33/0075; H01L 33/022; H01L 33/24; H01L 33/46; H01L 33/38; H01L 33/22
See application file for complete search history.

(56) References Cited

U.S. PATENT DOCUMENTS

2005/0062061 A1* 3/2005 Horng ................. H01L 33/0079
                                                        257/103
2007/0045608 A1    3/2007 Wang
(Continued)

FOREIGN PATENT DOCUMENTS

CN    1941435    4/2007
CN    103325908    9/2013
(Continued)

OTHER PUBLICATIONS

International Search Report dated Oct. 27, 2014, issued in International Application No. PCT/KR2014/000848.

*Primary Examiner* — Thanhha S Pham
(74) *Attorney, Agent, or Firm* — Steptoe & Johnson LLP

(57) ABSTRACT

The present invention relates to a light emitting diode and a method for manufacturing same, and more specifically relates to growing a GaN layer of high quality on an upper part of an AlGaInP-based light emitting diode to improve the light extraction efficiency of the light emitting diode, wherein the GaN layer has a larger band gap and a smaller refractive index than AlGaInP-based material. The AlGaInP-based light emitting diode of the present invention is characterized by forming the GaN layer on the upper surface, and the GaN layer preferably has a surface of a fine uneven pattern. The GaN layer can be grown in the same system after forming the AlGaInP-based light emitting diode without an additional process.

6 Claims, 4 Drawing Sheets

(51) Int. Cl.
  *H01L 33/28* (2010.01)
  *H01L 33/24* (2010.01)
  *H01L 33/46* (2010.01)
  *H01L 33/38* (2010.01)
  *H01L 33/00* (2010.01)

(52) U.S. Cl.
  CPC .............. *H01L 33/24* (2013.01); *H01L 33/38* (2013.01); *H01L 33/46* (2013.01); *H01L 2933/0025* (2013.01); *H01L 2933/0033* (2013.01)

(56) References Cited

U.S. PATENT DOCUMENTS

| | | |
|---|---|---|
| 2007/0069196 A1 | 3/2007 | Kako |
| 2008/0061307 A1 | 3/2008 | Ikeda |
| 2010/0295014 A1 | 11/2010 | Kang et al. |

FOREIGN PATENT DOCUMENTS

| | | |
|---|---|---|
| JP | 2008-159664 | 7/2008 |
| JP | 2010-050487 | 3/2010 |
| KR | 10-2002-0079659 | 10/2002 |
| KR | 10-0631981 | 10/2006 |
| KR | 10-1282775 | 7/2013 |
| WO | 2013049421 A2 | 4/2013 |

\* cited by examiner

[Fig. 1]
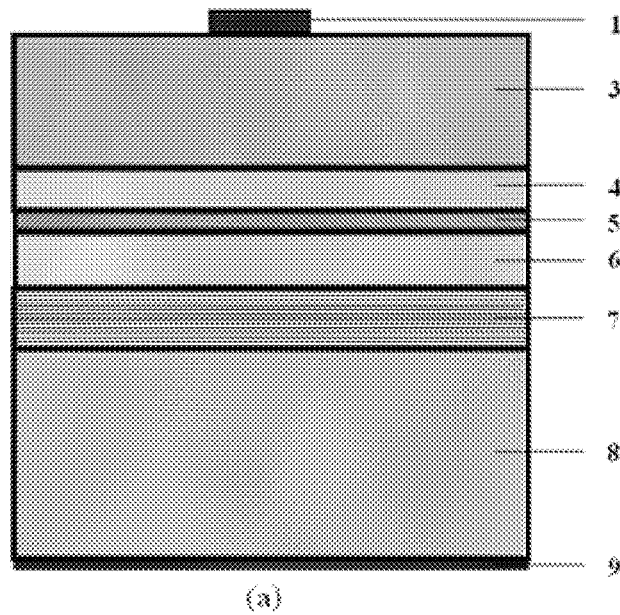
(a)
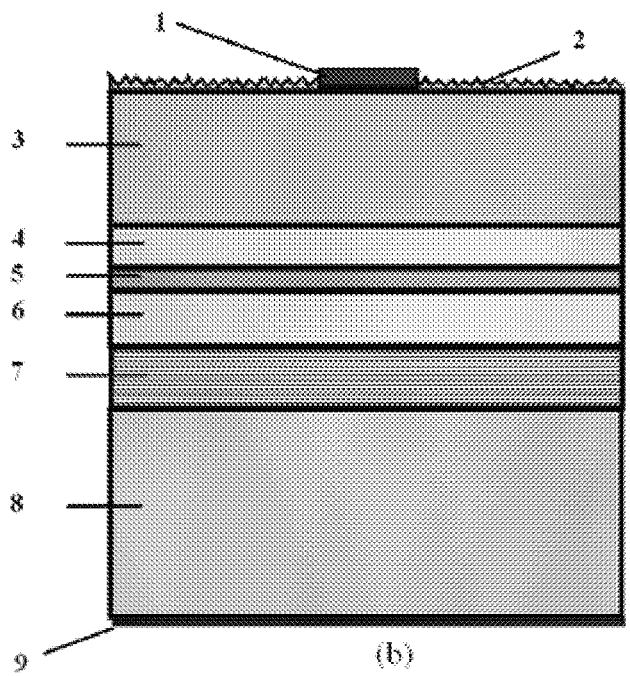
(b)

[Fig.2]
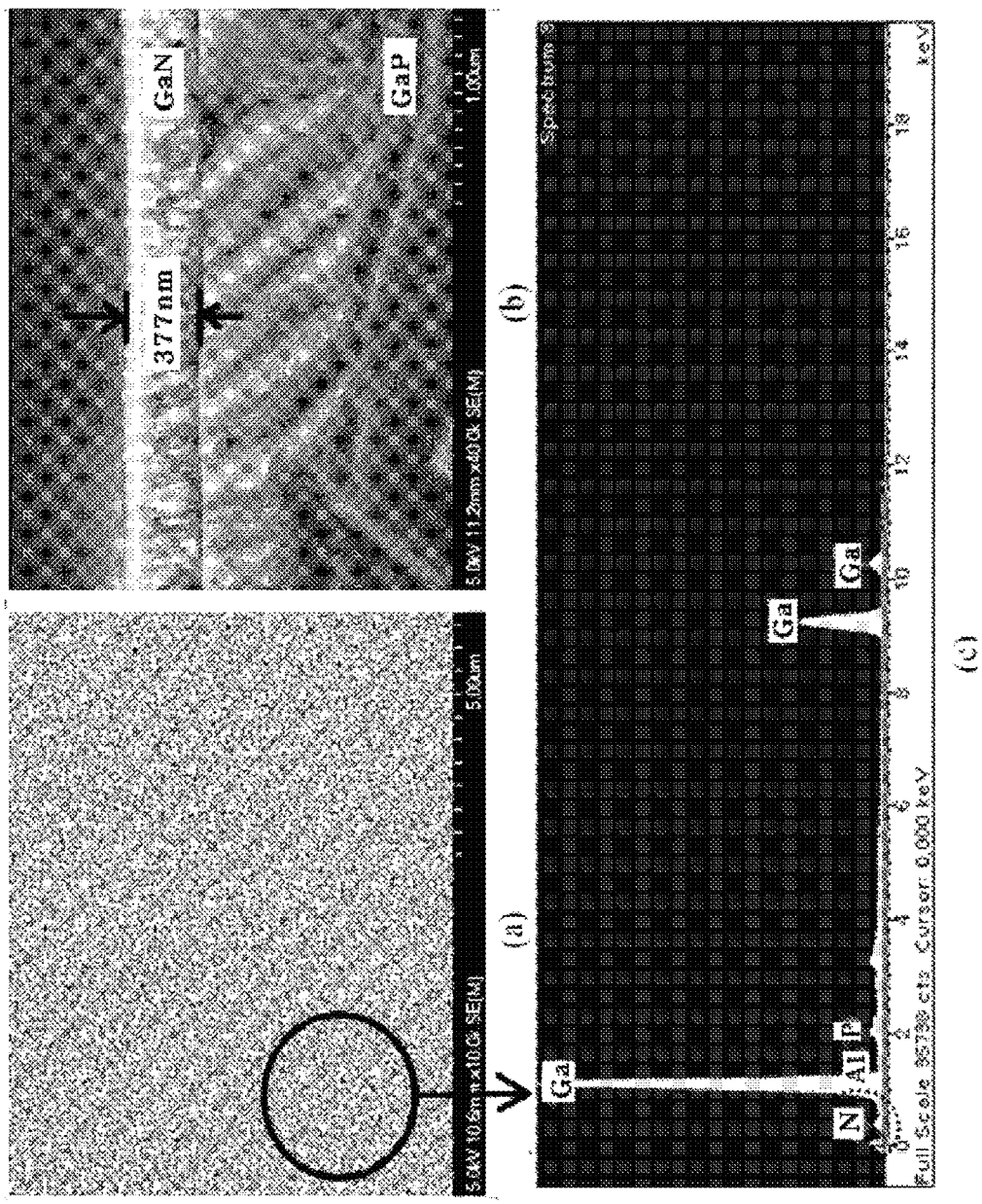

[Fig. 3]
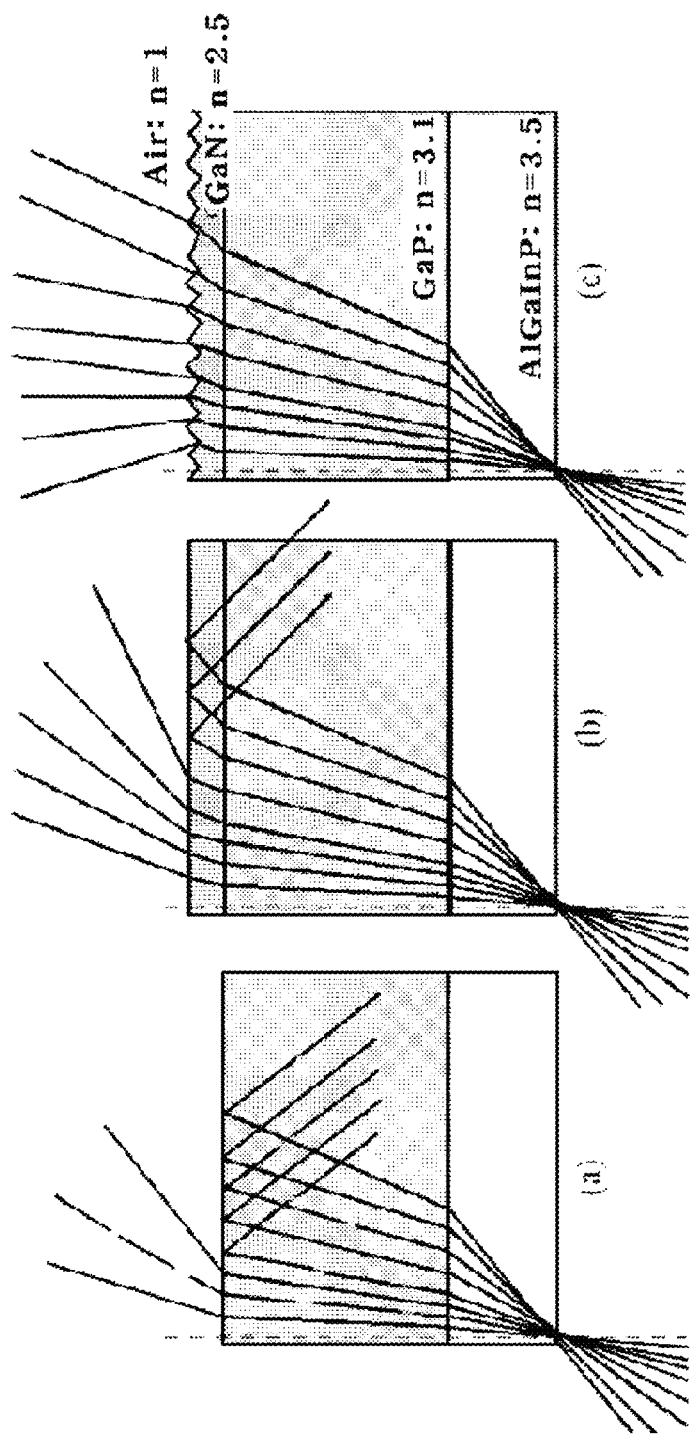

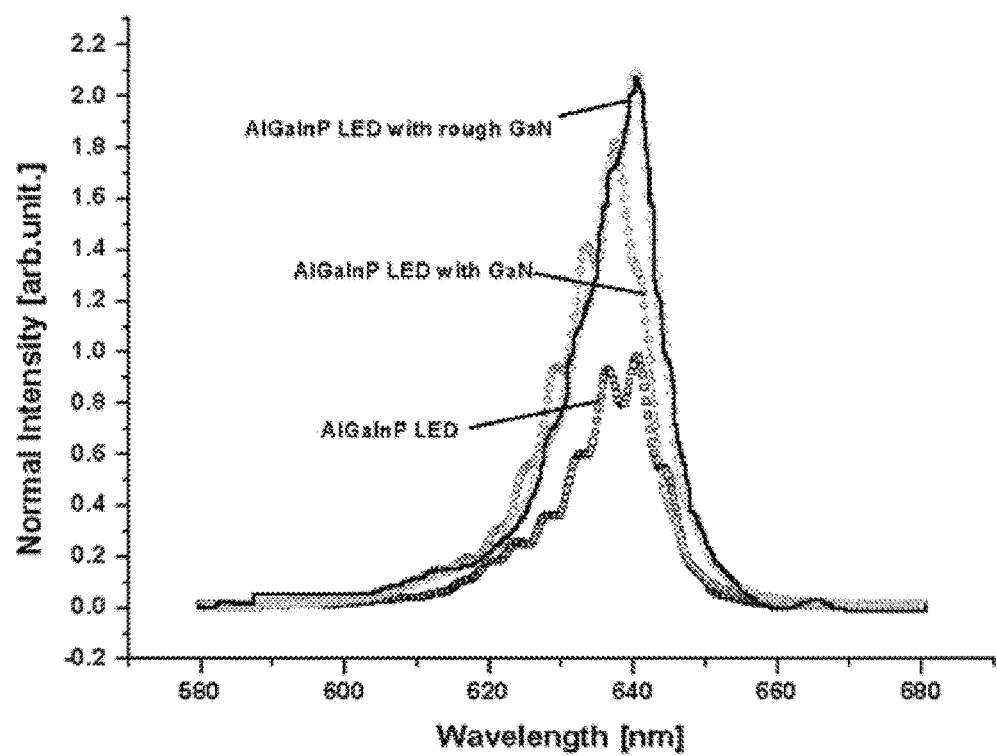
[Fig. 4]

ALUMINUM-GALLIUM-INDIUM-PHOSPHORUS-BASED LIGHT EMITTING DIODE HAVING GALLIUM NITRIDE LAYER OF UNEVEN TYPE AND METHOD FOR MANUFACTURING SAME

PRIORITY CLAIM

This application claims the benefit under 35 USC 371 to International Application No. PCT/KR2014/000848, filed Jan. 29, 2014, which is incorporated by reference in its entirety.

TECHNICAL FIELD

The present invention relates to a light-emitting diode and a method for fabricating the same, and more particularly, to growing a high-quality GaN layer, which has a band gap greater than and a refractive index lower than an AlGaInP-based material, on an AlGaInP light-emitting diode in order to increase the light extraction efficiency of the light-emitting diode.

BACKGROUND ART

AlGaInP-based light-emitting diode is a semiconductor device that converts electrical energy which is injected therein to light having a certain wavelength in the range of 570-630 nm. The wavelength of light that is generated by the light-emitting diode is determined by the magnitude of the band gap of the light-emitting diode. Specifically, the band gap size can be easily controlled by changing the composition ratio of Al to Ga, and for example, as the composition ratio of Al to Ga increases, the wavelength decreases.

AlGaInP-based light-emitting diodes are generally fabricated using a metal organic chemical vapor deposition (MOVCD) system that enables the growth of high-quality layers. Such AlGaInP-based light-emitting diodes generally have a structure in which an AlGaInP-based high-efficiency active layer configured to emit light having a certain wavelength is present between an n-type AlGaInP material layer and a p-type AlGaInP material layer. Because the active layer, the n-type layer and the p-type layer have relatively high resistances, each of the layers is grown to a thickness of 1 μm or less (total thickness: <3 μm) so that the light-emitting diodes will be used for general purposes.

Because the optical efficiency of such AlGaInP-based light-emitting diodes is determined by the internal quantum efficiency and light extraction efficiency thereof, it is required to increase at least one of such determination factors in order to increase the optical efficiency of the light-emitting diodes. An increase in the internal quantum efficiency is generally achieved by enlarging the emission region of the active layer. For this, an active layer having a multilayer structure, a current diffusion layer, and a layer for preventing the overflow of electrons and holes, etc., are mainly used. An increase in the light extraction efficiency is achieved by allowing light emitted from the active layer to be easily emitted to the outside of the light-emitting diode. For this, a reflective layer, a photonic crystal, and surface texturing, etc., are mainly used.

Among the above-described methods, the surface texturing is most widely used in various manners to increase the light extraction efficiency. Particularly, in the case of AlGaInP-based light-emitting diodes, the surface of a GaP layer that is used as an upper current diffusion layer is generally treated by a chemical etching process using a phosphoric acid-based compound to make the surface rough (texturing), thereby forming a light scattering surface. However, the chemical etching process causes defects or contaminants on the GaP surface to thereby deteriorate the characteristics of the AlGaInP-based light-emitting diode. Accordingly, there is a need for a method capable of texturing surfaces without using a chemical etching process in order to increase light extraction efficiency.

DISCLOSURE

Technical Problem

It is an object of the present invention to increase the light extraction efficiency of an AlGaInP-based light-emitting diode.

Another object of the present invention is to provide an AlGaInP-based light-emitting diode whose light extraction efficiency can be increased by surface texturing performed without using a chemical etching process.

Still another object of the present invention is to grow a rough GaN layer on the surface of an AlGaInP-based light-emitting diode without changing a growth system.

Technical Solution

An AlGaInP-based light-emitting diode according to the present invention has a GaN layer formed on the top surface thereof. The GaN layer is preferably a rough GaN layer, and is preferably formed by vapor deposition. The GaN layer is formed on the uppermost layer of the epitaxial layers of the light-emitting diode, and thus the top surface may be the surface of a current diffusion layer or a semiconductor layer.

The GaN layer is a material layer having a relatively high band gap and low refractive index compared to those of all materials that are used in the AlGaInP-based light-emitting diode, and thus the GaN layer can increase the light extraction efficiency of the AlGaInP-based light-emitting diode. As used herein, the expression "having a relatively high band gap" means that the GaN layer has a band gap higher than the other growth materials of the AlGaInP-based light-emitting diode so that it can transmit light emitted from the AlGaInP-based light-emitting diode without absorbing the light. In addition, the expression "having a relatively low refractive index" means that the GaN layer has a refractive index lower than the other growth materials of the AlGaInP-based light-emitting diode. The GaN layer has a refractive index of n=2.5. This refractive index is lower than the refractive index of the AlGaInP-based material (n=3.0-3.5), and is higher than the refractive index of epoxy (n=1.5-1.8) which is an encapsulating material that finally surrounds the light-emitting diode.

The GaN layer or the rough GaN layer increases light extraction efficiency by greatly reducing the amount of total internal reflection that acts as an obstacle in emitting light from the active layer to the outside of the light-emitting diode. As used herein, the term "rough" means that fine textures are formed on the surface, and may also be understood that the surface has rough surface characteristics.

The GaN layer is grown at a relatively low temperature, preferably about 400 to 700° C., more preferably about 500 to 550° C. Thus, a growth system for the AlGaInP-based light-emitting diode, which is grown at about 670 to 800° C. in the MOCVD system, may be used to grow the GaN layer. Namely, after the layers of the AlGaInP-based light-emitting diode are grown in the same MOCVD, the internal temperature of the system may be reduced, and the GaN layer may be grown with high quality on the uppermost layer of the layers.

The GaN layer can be formed to have a rough surface, if it is excessively doped during growth. As used herein, the term "excessively doped" may mean that the flow rate of a dopant precursor gas such as Mg, Si or Zn is set at about 300 sccm or more, preferably about 400 sccm or more. As the flow rate of the precursor increases, the surface becomes rougher. When a GaN layer is grown to have a certain thickness in the MOCVD system, followed by growth of an excessively doped GaN layer, a rough, high-quality GaN layer can be obtained.

The GaN layer is preferably grown to have a thickness of 100-2000 nm. If the thickness of the GaN layer is smaller than the upper limit of the above range, high-quality growth of GaN will be difficult due to the influence of a rough buffer layer having a thickness of about 50-60 nm, and if the thickness of the GaN layer is greater than the upper limit of the above range, a tope electrode having a thickness of about 2000-2300 nm, which is to be formed later, will be buried in the GaN layer, the possibility of occurrence of failure in final lamp packaging will be high.

In the present invention, the AlGaInP-based light-emitting diode is fabricated by growing a first-type AlGaInP-based semiconductor layer, an active layer and a second-type AlGaInP-based semiconductor layer on a substrate, and then growing a GaN layer (preferably, a rough GaN layer) thereon. Herein, the first-type and the second-type refer to n-type and p-type, or p-type and n-type, respectively. The growth may be performed by a technique known in the art, for example, MOCVD or the like, and the rough GaN layer may be grown by depositing GaN in the excessive doping environment as described above.

To improve the light emission efficiency of the light-emitting diode, it is preferable to grow a DBR layer between the substrate and the first-type semiconductor layer and a current diffusion later the second-type semiconductor layer and the GaN layer. After growth of the GaN layer, a top electrode is deposited thereon, and a bottom electrode is deposited under the substrate. Because the resistance of GaN is higher than the resistance of the GaP material or AlGaInP material of the light-emitting diode, a portion of the GaN layer, on which the top electrode is to be formed, is removed by, for example, etching, and then the top electrode is deposited in the removed portion.

Advantageous Effects

According to the present invention, the light extraction efficiency of the AlGaInP-based light-emitting diode can be increased by growing a GaN layer having a high band gap and a low refractive index on the top surface during growth of the AlGaInP-based light-emitting diode.

Particularly, the GaN layer can be grown in a rough form in the same system after growth of the AlGaInP-based light-emitting diode without using a chemical etching process or an additional process. Thus, the light extraction efficiency of the light-emitting diode can greatly be increased without causing defects or contaminants on the light-emitting diode, and an additional process for surface texturing is eliminated.

DESCRIPTION OF DRAWINGS

FIG. 1(a) is a cross-sectional view schematically showing the structure of a conventional AlGaInP-based light-emitting diode fabricated by an MOCVD system, and FIG. 1b is a cross-sectional view schematically showing the structure of an AlGaInP-based light-emitting diode having a rough GaN layer according to the present invention.

FIG. 2(a) is an electron microscope photograph of the surface of an AlGaInP-based light-emitting diode having a rough GaN layer according to the present invention; FIG. 2(b) is an electron microscope photograph showing the vertical structures of a GaP window layer and a rough GaN layer in the light-emitting diode; and FIG. 2(c) is a graph showing qualitative analysis data for a portion of the photograph of FIG. 2(a).

FIG. 3(a) is a schematic view illustrating the emission of light from a conventional AlGaInP-based light-emitting diode; FIG. 3(b) is a schematic view illustrating the emission of light from an AlGaInP-based light-emitting diode having a smooth GaN layer according to the present invention; and FIG. 3(c) is a schematic view illustrating the emission of light from an AlGaInP-based light-emitting diode having a rough GaN layer according to the present invention.

FIG. 4 is a graph showing the characteristics of a conventional AlGaInP-based light-emitting diode (a), an AlGaInP-based light-emitting diode having a smooth GaN layer (b) according to the present invention, an AlGaInP-based light-emitting diode having a rough GaN layer (c) according to the present invention.

BEST MODE

Additional aspects, features and advantages of the present invention will be understood from the following description of exemplary embodiments with reference to the accompanying drawings. For a better understanding of the present invention, some components in each of the drawings may be exaggerated, omitted or schematically drawn. In addition, the size of each component does not utterly reflect the actual size. The following embodiments are intended to illustrate preferred forms so that those skilled in the art will understand and easily carry out the present invention, and these embodiments are not intended to limit the scope of the present invention. Therefore, those skilled in the art will appreciate that various changes and modifications are possible, without departing from the sprit and purpose of the present invention.

FIG. 1(a) schematically shows the structure of a conventional AlGaInP-based light-emitting diode fabricated by an MOCVD system, and FIG. 1b schematically shows the structure of an AlGaInP-based light-emitting diode having a rough GaN layer 2 according to the present invention. The conventional AlGaInP-based light-emitting diode (FIG. 1a) and the AlGaInP-based light-emitting diode according to the present invention (FIG. 1(b)) all have a structure in which a reflective layer 7, a lower confining layer 6, an active layer 5, an upper confining layer 4 and a window layer 3 are sequentially grown and deposited on a substrate 8. On the bottom surface of the substrate 8, a bottom electrode 9 is formed, and the top surface of the window layer 3, a top electrode 1 is formed. Formation of these light-emitting diodes may be performed according to an AlGaInP light-emitting diode fabrication process known in the art.

The construction of layers that may be included in the conventional AlGaInP light-emitting diode and the AlGaInP light-emitting diode of the present invention will now be described in more detail. The light-emitting diode according to the present invention is based on AlGaInP, and thus the active layer 5 is an $(Al_xGa_{1-x})_{1-y}In_yP$ layer. The active layer 5 may have a structure selected from among a single-layer structure, a quantum well structure, a multiple-quantum-well structure, and the like. Preferably, the active layer 5 is composed of a plurality of layers, and multiple quantum wells are formed throughout the active layer by forming layers while changing an X value. Thus, more electrons are occupied in the lower energy level of the multiple quantum wells, and as a result, the electrons may be easily transited from the conduction band to the valence band so that the light emission efficiency can be improved. The lower confining layer 6 is an n-type AlGaInP layer, and the upper confining layer 4 is a p-type AlGaInP layer.

The substrate 8 is an n-type GaAs substrate. Because the GaAs substrate has a high ability to absorb light, light that is emitted from the active layer 4 in a downward direction or the direction of substrate may be absorbed by the GaAs substrate so that the light emission efficiency of the light-emitting diode can be reduced. For this reason, as understood by those skilled in the art, in order to increase the light emission efficiency without removing the GaAs substrate, the reflective layer 7 composed of a plurality of layers is grown on the substrate 8 so that light that is emitted from the active layer 4 in the direction of the substrate 8 will be reflected in a front (upward) direction. The reflective layer is a distributed Bragg reflector (DBR) layer which is composed of a multilayer structure selected from among AlGaInP/AlGaInP, AlAs/AlGaAs, AlAs/GaAs, AlAs/AlGaInP and the like depending on the light emission wavelength of the light-emitting diode, which is determined according to the composition of the active layer 4 $(((Al_xGa_{1-x})_{1-y}In_yP$ layer).

The upper window layer 3 formed on the upper confining layer 4 essentially serves to diffuse current, and is formed of a transparent material having low resistivity. Preferably, it is a p-type GaP layer. In order to ensure the effect of diffusing current and the effect of enlarging a region for lateral emission, the window layer 3 is grown to a thickness of several to several tens of microns, preferably about 15 μm or more.

The top electrode 1 serving to apply positive voltage to the active layer 5, and the bottom electrode 9 serving to apply negative electrode to the active layer 5, may be formed of AuGe and AuBe, respectively, which are AlGaInP-based ohmic contact materials, and examples of additional electrode materials are well known in the art.

In addition to the above-described light-emitting diode structure, the AlGaInP-based light-emitting diode (FIG. 1*b*) according to the present invention has a structure in which a GaN layer, preferably a rough GaN layer 2, is grown on the window layer 3. The rough GaN layer 2 serves to increase the light extraction efficiency of the light-emitting diode, and may be grown by means of the MOCVD system, used to grow the other layers of the AlGaInP-based light-emitting diode (FIG. 1*b*), without using a separate processor or system.

FIG. 2 depicts electron micrograph photographs of the AlGaInP-based light-emitting diode having the rough GaN layer according to the present invention. Specifically, FIG. 2(*a*) is a photograph showing the top surface; FIG. 2(*b*) is a photograph showing the lateral side of the GaN layer grown on the window layer; and FIG. 2(*c*) shows qualitative analysis data for a portion of the surface shown in FIG. 2(*a*). The rough GaN layer was grown by depositing a high-quality GaN layer to a certain thickness in the MOCVD system at 500° C. by use of 150 sccm of TMGa and 45000 sccm of $NH_3$, and then depositing a GaN layer in the same growth environment while supplying about 400 sccm of Cp2Mg. As shown in the surface photograph (FIG. 2*a*), the surface of the GaN layer has innumerable irregularities which are fine textured patterns. As shown in the photograph of the lateral side (FIG. 2(*b*)), it can be seen that a rough GaN layer having a thickness of about 370 nm was uniformly grown on the window layer (GaP). In addition, as shown in the graph (FIG. 2(*c*)), the results of qualitative analysis indicated that "N" was detected in the layer grown on the GaP window layer. Because the material "N" was not used in growth of the AlGaInP-based light-emitting diode, it can be seen that the material grown on the GaP window layer is high-quality GaN.

FIG. 3 shows the emission of light from the active layer changes depending on the presence or absence of the GaN layer. Specifically, FIG. 3 shows different routes by which light is emitted from a conventional AlGaInP-based light-emitting diode (FIG. 3(*a*)), an AlGaInP-based light-emitting diode having a smooth GaN layer according to the present invention (FIG. 3(*b*)), and an AlGaInP-based light-emitting diode having a rough GaN layer according to the present invention (FIG. 3(*c*)). In the case of the light-emitting diode (FIG. 3(*a*)), light emitted from the point light source of the active layer is emitted to the outside of the light-emitting diode through the upper confining layer and the window layer, which have different refractive indices, and a considerable of the light is reflected from the surface boundary of the window layer and directed toward the inside of the light-emitting diode. However, in the case of the light-emitting diode having the smooth GaN layer (FIG. 3(*b*)), the amount of light reflected from the surface boundary is significantly smaller than that in the case of the light-emitting diode (FIG. 3(*a*)) due to the lower refractive index of the GaN material. In addition, in the case of the light-emitting diode having the rough GaN layer (FIG. 3(*c*)), a great critical angle is provided by the fine textured patterns, and thus the amount of light that is reflected to the inside of the light-emitting diode due to total internal reflection can be significantly reduced.

FIG. 4 shows photoluminescence (PL) characteristics measured in each of light-emitting diodes having the structures illustrated in FIG. 3. For comparison of the PL characteristics, a smooth GaN layer and a rough GaN layer were each grown on samples grown under the same conditions as those for a conventional AlGaInP-based light-emitting diode. It can be seen that, compared to the conventional AlGaInP-based light-emitting diode, the light-emitting diode having the smooth GaN layer showed an increase of about 1.8 times in the intensity of the peak wavelength, and the light-emitting diode having the rough GaN layer showed an increase of about 2.1 times in the intensity of the peak wavelength. Because these light-emitting diodes have the same characteristics before growth of the GaN layer, it can be seen that the increase in the photoluminescence, that is, the increase in the efficiency of the light-emitting diode, results from growth of the GaN layer according to the present invention.

Although the exemplary embodiments of the present invention have been described, it should be understood that the scope of the present invention should be defined by the appended claims.

The invention claimed is:

1. An AlGaInP-based light-emitting diode having both an electrode and an uppermost layer around the electrode directly upon an upper surface of the GaP window layer, wherein the uppermost layer is a rough GaN layer, and wherein both the electrode and the uppermost layer around the electrode directly contact and are on the upper surface of the GaP window layer.

2. The AlGaInP-based light-emitting diode of claim 1, wherein the GaP window layer is a p-type GaP window layer.

3. The AlGaInP-based light-emitting diode of claim 2, wherein the GaN layer has a thickness of 100-2000 nm.

4. A method for fabricating an AlGaInP-based light-emitting diode of claim 1, comprising the steps of:
   growing a first-type AlGaInP-based semiconductor layer, an active layer and a second-type AlGaInP-based semiconductor layer on a substrate;
   growing the GaP window layer on the second-type AlGaInP-based semiconductor layer;
   forming the electrode directly upon the upper surface of the GaP window
   growing the rough GaN layer on the upper surface of the GaP window layer, wherein the rough GaN layer providing the uppermost layer around the electrode, both the electrode and the uppermost layer around the electrode directly contact and being on the upper surface of the GaP window layer.

5. The method of claim 4, wherein the rough GaN layer is grown in an excessive doping environment for surface texturing.

6. The method of claim 4, further comprising, before growing the first-type AlGaInP-based semiconductor layer, a step of growing a DBR layer.

* * * * *